(12) United States Patent  (10) Patent No.: US 6,672,374 B1
Lin  (45) Date of Patent: Jan. 6, 2004

(54) HEAT SINK COUPLING DEVICE

(76) Inventor: Jeh-Ren Lin, 5F, No. 64, Sec. 4, Cheng Der Road, Shih Lin Area, Taipei City (TW)

( * ) Notice: Subject to any disclaimer, the term of this patent is extended or adjusted under 35 U.S.C. 154(b) by 0 days.

(21) Appl. No.: 10/277,668

(22) Filed: Oct. 23, 2002

(51) Int. Cl.[7] .............................................. F24H 3/02
(52) U.S. Cl. ...................... 165/121; 165/80.3; 257/727; 361/697
(58) Field of Search ............................... 165/80.3, 121, 165/185, 122; 361/695, 697; 257/718, 726, 727; 248/458, 457

(56) References Cited

U.S. PATENT DOCUMENTS

| | | | | |
|---|---|---|---|---|
| 5,724,228 A | * | 3/1998 | Lee ............................. | 361/697 |
| 6,160,704 A | * | 12/2000 | Rusate ........................ | 361/697 |
| 6,199,624 B1 | * | 3/2001 | Wotring ...................... | 165/80.3 |
| 6,311,766 B1 | * | 11/2001 | Lin et al. ..................... | 165/80.3 |
| 6,392,885 B1 | * | 5/2002 | Lee et al. .................... | 361/697 |
| 6,401,806 B1 | * | 6/2002 | Lee et al. .................... | 165/80.3 |
| 6,525,941 B1 | * | 2/2003 | Lai .............................. | 361/697 |

* cited by examiner

Primary Examiner—Terrell McKinnon
(74) Attorney, Agent, or Firm—Troxell Law Office PLLC

(57) ABSTRACT

A heat sink coupling device, specifically a heat sink coupling device utilized to cool and reduce the temperature of a central processing unit in a computer, comprised of a coupling base, the top surface of which provides for the selectable installation of a wide range of different specification cooling fans, latch arms extending downward from the four corners of the coupling base, a curved hook formed at the bottom end of each latch arm, and elastic elements at the two sides of the coupling base that are punched formed into a projecting, free-floating state. Given the foregoing structure, the heat sink coupling device of the present invention conveniently affords the flexible installation of a wide range of different specification cooling fans, while the operating personnel completes the installation of a cooling fan preassembled to a heat sink element onto the heat dissipation element clip mount in a single step, thereby increasing assembly efficiency and practical functionality.

9 Claims, 5 Drawing Sheets

HEAT SINK COUPLING DEVICE

BACKGROUND OF THE INVENTION

1) Field of the Invention

The invention herein relates to a heat sink coupling device, specifically a heat sink coupling device utilized to cool and reduce the temperature of a central processing unit in a computer, wherein a cooling fan preassembled to the heat sink dissipation element is installed with total convenience onto a heat dissipation element clip mount.

2) Description of the Prior Art

Computer products of various models and performance have been released on the market by a computer information industry now enjoying prolific development. Of these, the central processing unit (CPU) inside a computer occupies the most important position, with the Intel Pentium 4 chip currently the most widely used CPU. The internal circuit of the said chip is capable of processing speeds from 1 GHz up to 2.2 GHz and given such rapid operating frequencies, since heat is generated because of electrical resistance to flowing current when the CPU is utilized, a heat sink must be installed to maintain the operating temperature of the CPU within a certain range. To prevent damage to the internal circuit of the CPU by excessively high temperatures that renders the entire computer inoperable, the heat sink affixing method shown in FIG. 1 is utilized for the said CPU chip, wherein the said CPU 10 is contained in an opening 110 at the center of a heat dissipation element clip mount 11 and, furthermore, its lower extent is connected to a circuit board (not shown in the drawings), the pins extending outward along the bottom surface of the CPU 10 inserted into the circuit board and secured therein. The said heat dissipation element clip mount 11 has a rectilinear base plate 111 that is fastened to the circuit board, the opening 110 containing the CPU 10 respectively formed at the center of the base plate 11 heat dissipation element clip mount 111, a protruding stop 112 disposed at each of the four corners of the base plate 111 and, furthermore, an anchoring hole 113 formed at an appropriate location through each stop 112. A heat dissipation element 12 is installed at the upper extent of the CPU 10 that is contained in the center of the heat dissipation element clip mount 11, wherein since the junction surface between the heat dissipation element 12 and the CPU 10 is filled with heat conductive paste or fins such that no gaps are present along the junction surface, heat generated by the CPU 10 is transferred to the heat dissipation element 12. The said heat dissipation element 12 is typically constructed of aluminum or copper material having optimal heat transferring efficiency and, after the aluminum or copper material are melted into a liquid state within a furnace, it is molded and extruded into the heat dissipation element 12 shown in drawing; since the surface of the heat dissipation element 12 has a plurality of crenulations and ridges, the surface area of heat dissipation is increased and, furthermore, a cooling fan 13 screw fastened onto the upper extent of the said heat dissipation element 12 blows cold air to cool and reduce the temperature of the chip. Two guide slots 120 are formed into the upper end of the heat dissipation element 12 along the two sides of the cooling fan 13 to provide for nesting a latch 14 in each of the guide slots 120 and thereby affixing the heat dissipation element 12 of the cooling fan 13 onto the heat dissipation element clip mount 11, the structure of the conventional latch 14, as indicated in FIG. 2, is comprised of a retaining plate 140 having a retaining section 140a arcuately inset along its center, a latch arm 140b contoured at one extremity of the retaining plate 140, a curved hook 140c formed at the bottom end of the latch arm 140b, a clevis section 140d formed at the other extremity of the retaining plate 140; and a latch handle 141, the said clasp handle 141 having a press section 141a formed at its upper extremity, a hook 141c formed at the bottom extremity of the clasp handle 141, and a check tab 141b punched out into a free-floating state at the center of the clasp handle 141.

The clasp handle 141 of the said latch 14 is capable of being conjoined to the clevis section 140d of each retaining plate 140 to constitute a unitary structural entity, with the clasp handle 141 check tab 141b arrested at the bottom of the retaining plate 140 clevis section 140d entrance such that the clasp handle 141 conjoined onto the retaining plate 140 cannot be dislodged such that during utilization, the retaining plates 140 are thereby held in the guide slots 120 of the heat dissipation element 12, with the hooks 140c at the bottom extremities of the retaining plate 140 latch arms 140b as well as the hooks 141c at the bottom extremities of the clasp handles 141 respectively engaged in the anchoring holes 113 in the stops 112 at each of the four corners of the base plate 111, enabling the heat dissipation element 12 of the cooling fan 13 to be firmly affixed into the heat dissipation element clip mount 11.

Following numerous tests conducted by the applicant, the said latches 14 utilized to affix the heat dissipation element 12 to the heat dissipation element clip mount 11 were found to have several shortcomings worthy of improvement. For example, since the guide slots 120 of the heat dissipation element 12 in which the said latch 14 retaining plates 140 rest are fabricated by a mechanized cutting process, the heat dissipation element 12 must undergo many mechanical finishing procedures. To position the latch 14 retaining plates 140 in the heat dissipation element 12 guide slots 120, since the installer must not only visually ascertain whether the retaining plates 140 are correctly placed into guide slots 120 but thereafter also complete two attachment steps to engage the latches 14 into the anchoring holes 113 in the heat dissipation element clip mount 11 stops 112, this consumes considerable assembly time and, furthermore, the relatively narrow latch 14 retaining plates 140 causes the force affixing the heat dissipation element 12 to become linearly distributed and incapable of even application against every portion of the heat dissipation element 12, resulting in a less than optimal distribution of exerted force for the attachment of the heat dissipation element 12 to the heat dissipation element clip mount 11, especially as the contact surface area between the latch 14 retaining plates 140 and the clasp handles 141 are quite small and the stress at the four points of the retaining plate 140 clevis sections 140d and the clasp handle 141 check tabs 141b from the distribution of the applied force easily leads to the material fatigue and deterioration of the latch 14 components and results in the shortening of usable service life.

In view of the said conventional latches 14 that affix the heat dissipation element 12 onto the heat dissipation element clip mount 11, their relatively complicated installation process, and their greater labor cost of installation, the applicant conducted research into further improvement based on many years of engagement in the research and development of the relevant products which following continuous experimentation culminated in the successful development of the heat sink coupling device of the invention herein.

SUMMARY OF THE INVENTION

The primary objective of the invention herein is to provide a heat sink coupling device in which since the force exerted against a heat dissipation element on a heat dissipation element clip mount is of an evenly distributed state along the surface of the heat dissipation element, usable service life is not shortened due to component material fatigue because force is unequally applied during utilization.

Another objective of the invention herein is to provide a heat sink coupling device in which a selectable installation of a wide range of different specification cooling fans enables a cooling fan to be preassembled to the heat sink dissipation element and installed onto the heat dissipation element clip mount in a procedure that is conveniently flexible and adjustable.

TECHNOLOGICAL MEANS

To achieve the said objectives, the invention herein provides a heat sink coupling device consisting of a heat sink element coupling base having different specification screw holes at its four corners that provides for the installation of numerous cooling fans onto the coupling base, the said coupling base is of press formed one-piece construction with latch arms contoured such that they extend downward from two sides and, furthermore, each latch arm has a curved hook formed at the bottom end; the hooks of the latch arms at the four corners of the coupling base are engaged into anchoring holes in stops at the four corners of the heat dissipation element clip mount and the installer only has to complete a single attachment step to achieve the evenly distributed attachment force required to install the heat dissipation element into the heat dissipation element clip mount; the coupling base of the said heat sink coupling device has elastic elements at the two sides that are punched formed into a projecting, free-floating state and capable of exerting force against a heat dissipation element ensconced within the coupling base such that its lower extent is in firm contact on a CPU chip. To enable the easy removal of the heat dissipation element, a pull handle is disposed on a cross member connecting two latch arms at one side of the coupling base such that operating the pull handle spreads apart the said latch arms, resulting in the easy release of the hooks at the bottom ends of the latch arms from the anchoring holes of the heat dissipation element clip mount and, as such, installation personnel can remove the heat dissipation element from the coupling base for inspection or replacement in a procedure that is totally convenient.

To enable a further understanding of the features and functions of the present invention, the brief description of the drawings are followed by the detailed description of the invention herein.

DETAILED DESCRIPTION OF THE INVENTION

Figure 3:
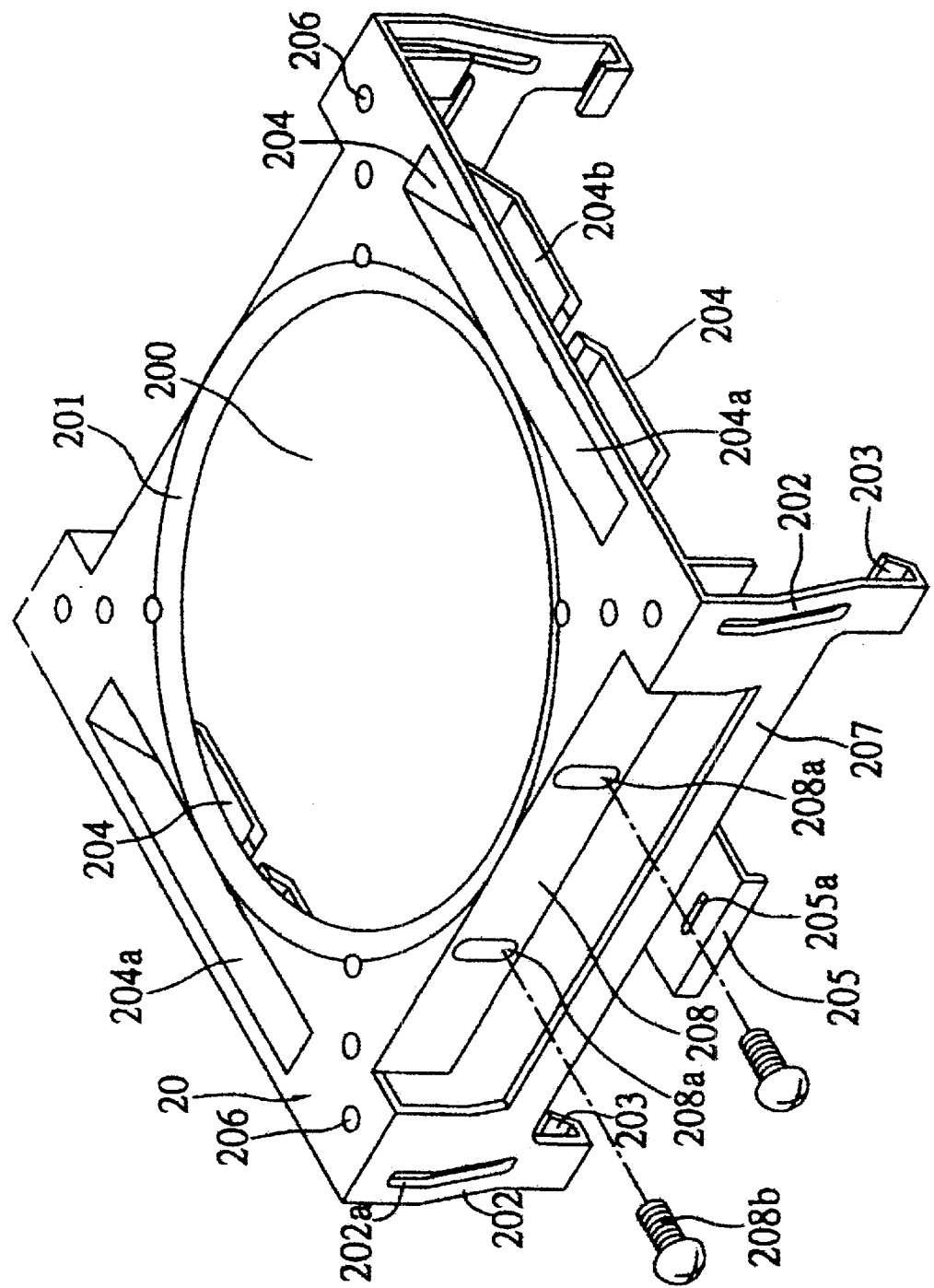
FIG. 3 is an isometric drawing of the heat sink coupling device of the invention herein.

Referring to FIG. 3, the heat sink coupling device of the invention herein is comprised of a one-piece, press formed coupling base 20, the top surface of which provides for the installation of a wide range of different specification cooling fans; a circular opening 200 at the center of the coupling base 20 that provides for the intake of air; a bevelled surface 201 formed along the inner circumference of the circular opening 200 that serves as a diverting edge; latch arms 202 extending downward from the four corners of the coupling base 20, with each latch arm 202 having a curved hook 203 formed at the bottom end; elastic elements 204 at the two sides of the coupling base 20 that are punched formed into a projecting, free-floating state, each said elastic element 204 having a curvilinearly profiled retaining section 204b capable of exerting force against a heat dissipation element 30 ensconced within the coupling base 20 such that the heat dissipation element 30 in the heat dissipation clip mount 11 is immovable; a pull handle 205 disposed on a cross member 207 between two latch arms 202 at one side of the coupling base 20 such that operating the pull handle 205 spreads apart the said latch arms 202, consequently enabling the easy release of the hooks 203 at the bottom ends of the latch arms 202 from the anchoring holes 113 of the heat dissipation element clip mount 11.

The said heat sink coupling device of the invention herein is fabricated such that the coupling base 20 is of a one-piece, press formed construction, the most preferred embodiment of which consists of a highly resilient material and aluminum or copper metal having optimal heat dissipation efficiency, with a plurality of screw holes 206 arrayed inward along the diagonal corner axes of the coupling base 20 top surface to provide for the selectable installation of a most commonly utilized computer system cooling fan, namely a unit having 6 cm×6 cm, 7 cm×7 cm, or 8 cm×8 cm specifications, onto the top surface of the coupling base 20, to thereby flexibly support various component and assembly options. Any of the said cooling fans and the heat dissipation element 30 are both first installed to the coupling base 20 (a cooling fan is not shown in the figures), compared to the prior art method wherein the cooling fan is directly installed to the heat dissipation element which is then utilized to affix it onto the heat dissipation element clip mount, but since screw holes for a chosen cooling fan of certain specifications are initially drilled (the screw holes drilled in the heat dissipation element affecting heat dissipation efficiency), installing a replacement fan of other specifications is not possible, demonstrating that the heat sink coupling device of the invention herein effectively affords more spatial provisions for greater installation flexibility.

In the said heat sink coupling device of the invention herein, the coupling base 20 has the circular opening 200 and, furthermore, the inner rim of the circular opening 200 is throated downward into a bevelled surface 201 that guides currents of air straight and without turbulence, enabling the cooling fan installed on the top surface of the coupling base 20 to rapidly intake air towards the lower extent of the circular opening 200. A slot 204a is punch formed at each of the two sides of the coupling base 20 and the punched out elastic elements 204 are in a free-floating state along these slots 204a, with each said elastic element 204 having a curvilinearly profiled retaining section 204b capable of exerting force when flexed, enabling the downward surface contact of the elastic elements 204.

In the said heat sink coupling device of the invention herein, the latch arms 202 are punched out and contoured such that each is aligned with the slots 204a at the two sides of the coupling base 20 and the said latch arms 202 extend downward from the from the four corners of the coupling base 20, wherein two latch arms 202 at the same side are connected by one cross member 207 to increase the amount of lateral pull force withstandable by the latch arms 202 and a free-floating nib 202a is formed at the center of the latch arm 202 bodies to increase the structural strength at the engagement force applied between the latch arms 202 and their bodies. Additionally, each latch arm 202 has the curved hook 203 formed downward at their bottom ends to provide for attachment and the generation of contact force.

A guide plate 208 is punched formed and bent out laterally at the two sides of the latch arms 202 on the coupling base 20 and a vertical, elongated guide hole 208a is disposed at an appropriate position along each of the two sides of the said guide plates 208 that provide for the insertion of screws 208b into threaded holes 30a at the two sides of the heat dissipation element 30 for fastening it inside the coupling base 20, wherein the hole diameters of the guide holes 208a are larger than the outer diameters of the screws 208b, but since the guide plates 208 have clearance variability towards two sides, the heat dissipation element 30 can be moved up and down for adjustment at the guide plates 208 without dislodging such that the heat dissipation element 30 ensconced at the coupling base 20 continues to stay adjoined to the heat dissipation element clip mount 11, and when the elastic element 204 tips are exerted against the heat dissipation element 30, the said guide plates 208 remain firmly fastened to the top lateral edges of the heat dissipation element 30 such that the heat dissipation element 30 is situated in the correct latched position, thereby reducing the amount of time required by the assembler to adjust the latched position of the heat dissipation element 30 during its installation into the coupling base 20.

Figure 1:
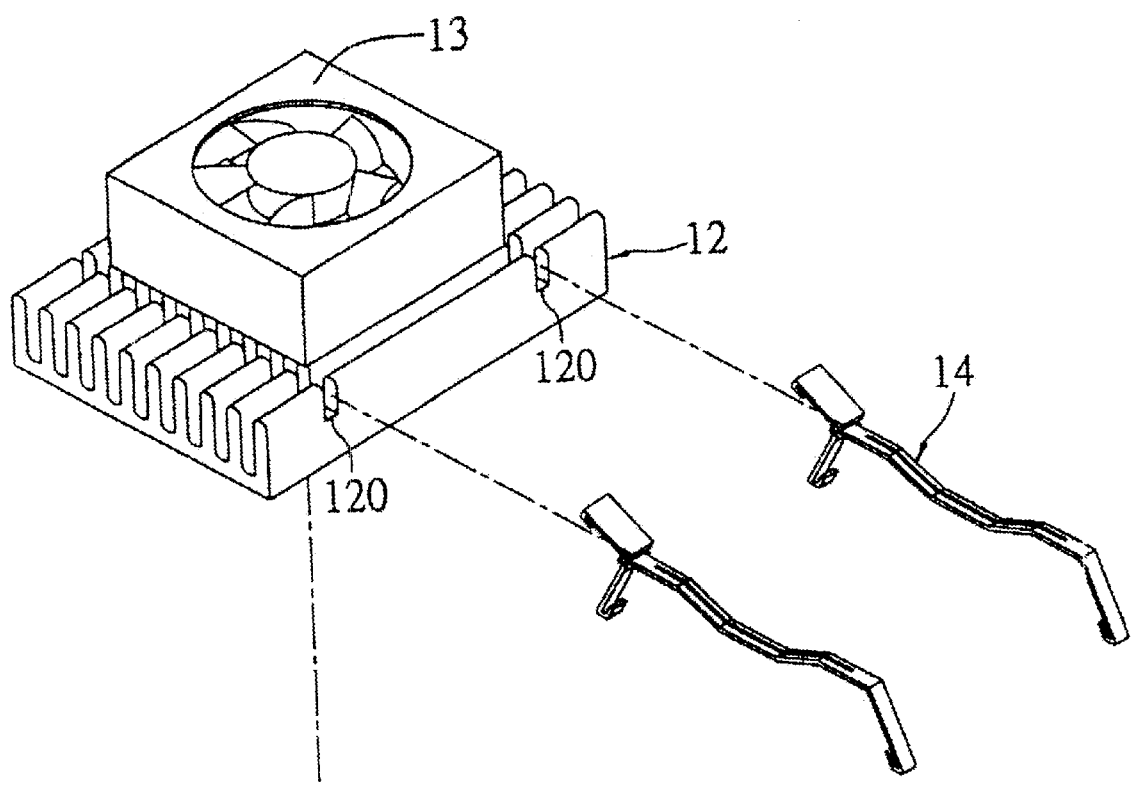
FIG. 1 is an isometric drawing of conventional latches utilized for affixing a heat dissipation element.
Figure 1:
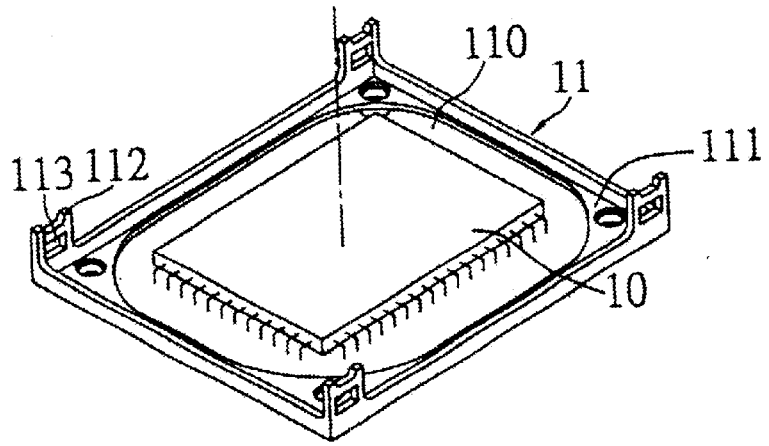
Figure 2:
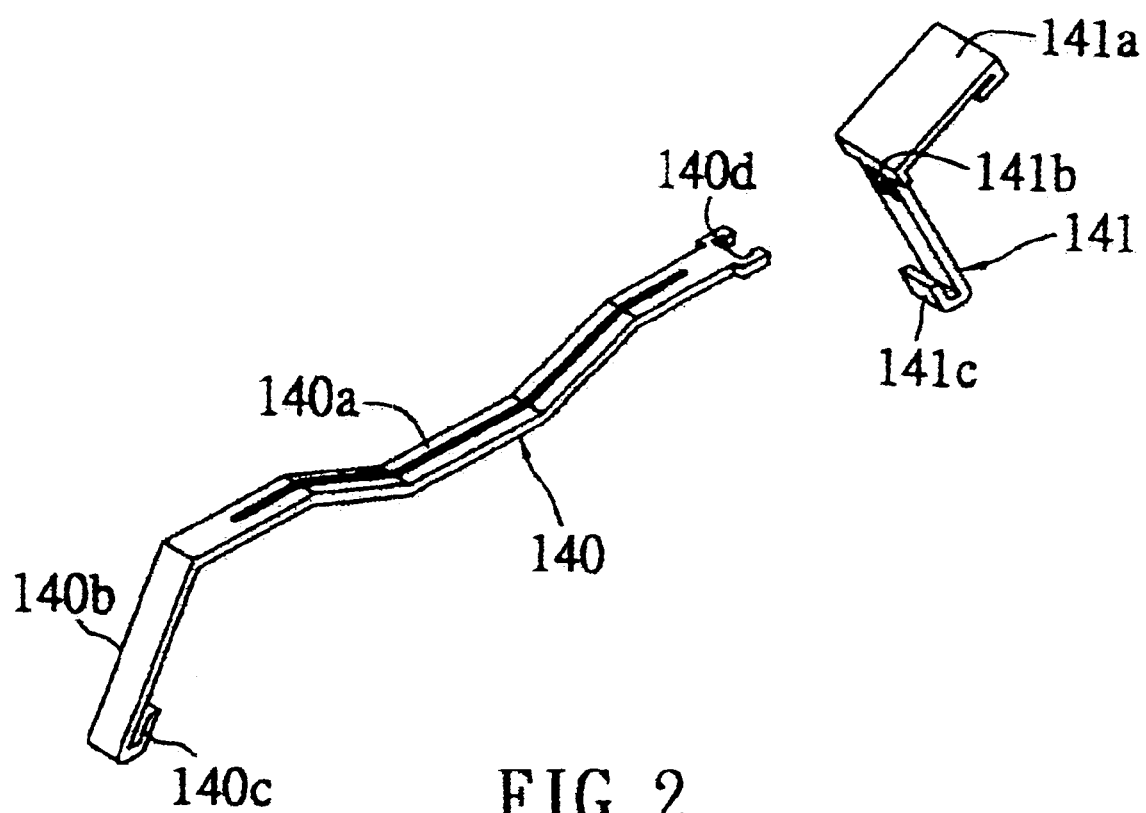
FIG. 2 is an isometric drawing is an exploded drawing is an exploded drawing of a conventional latch component.
Figure 4:
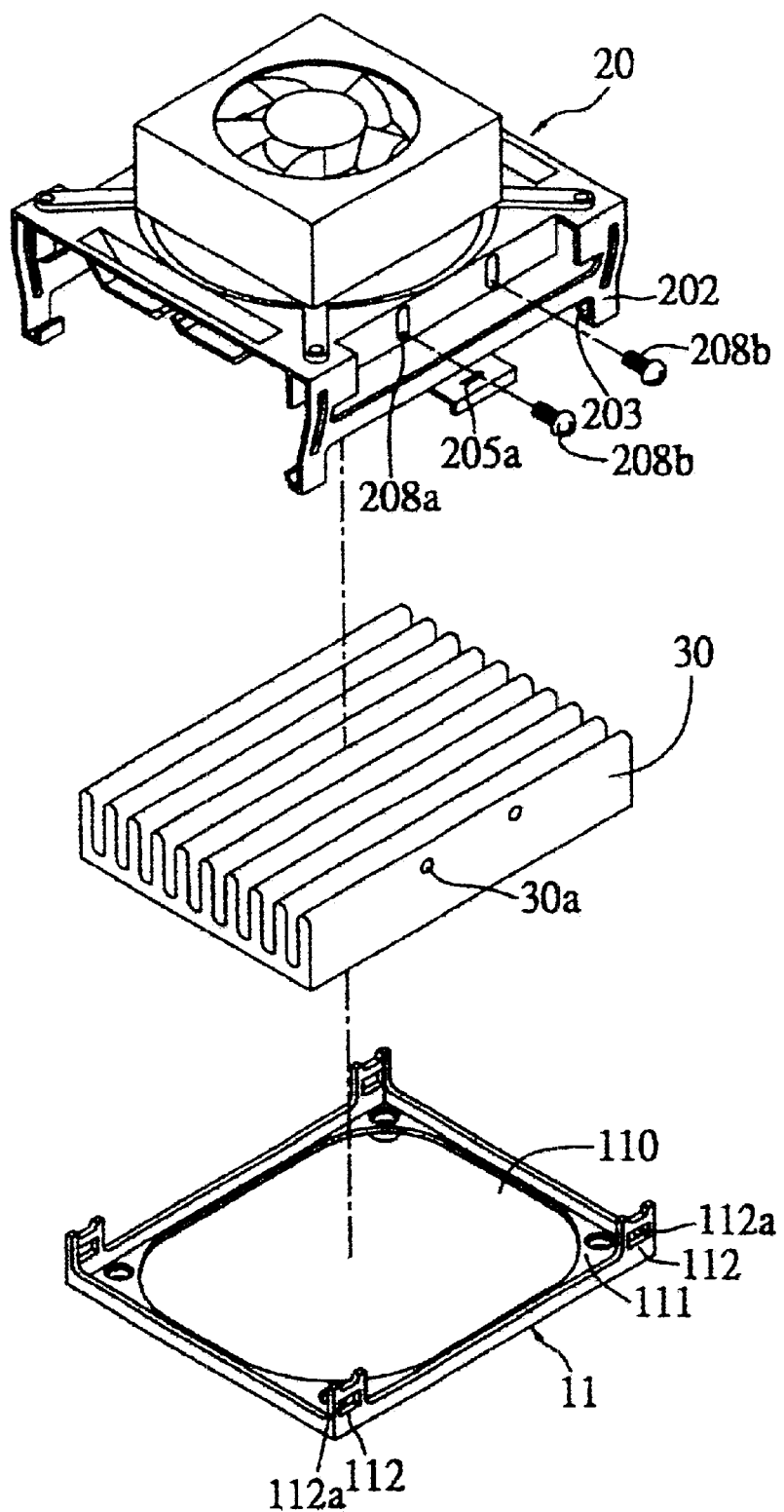
FIG. 4 is an exploded drawing of the heat dissipation element and how it is ensconced in the heat sink coupling device of the invention herein.

Referring to FIG. 4, the drawing of the heat dissipation element 30 and how it is ensconced in the heat sink coupling device of the invention herein, the heat sink coupling device of the invention herein supports utilization with the heat dissipation element clip mount 11 disclosed in FIG. 1; the said heat dissipation element clip mount 11 is an accessory component now widely utilized by computer manufacturers in various series of computer systems. The said heat dissipation element clip mount 11 has an opening 110 in the center of its base plate 111, a protruding stop 112 disposed at each of the four corners of the base plate 111 that are aligned with the coupling base 20 latch arms 202, an anchoring hole 113 formed at an appropriate location through each stop 112, the anchoring hole 113 in the said stop 112 capable of being engaged by the hooks 203 at the bottom ends of the coupling base 20 latch arms 202, enabling a connective force that merges the coupling base 20 and the heat dissipation element clip mount 11 into a unitary structural entity, with the heat dissipation element 30 contained therein firmly ensconced in position such that it is immovable.

Figure 5:
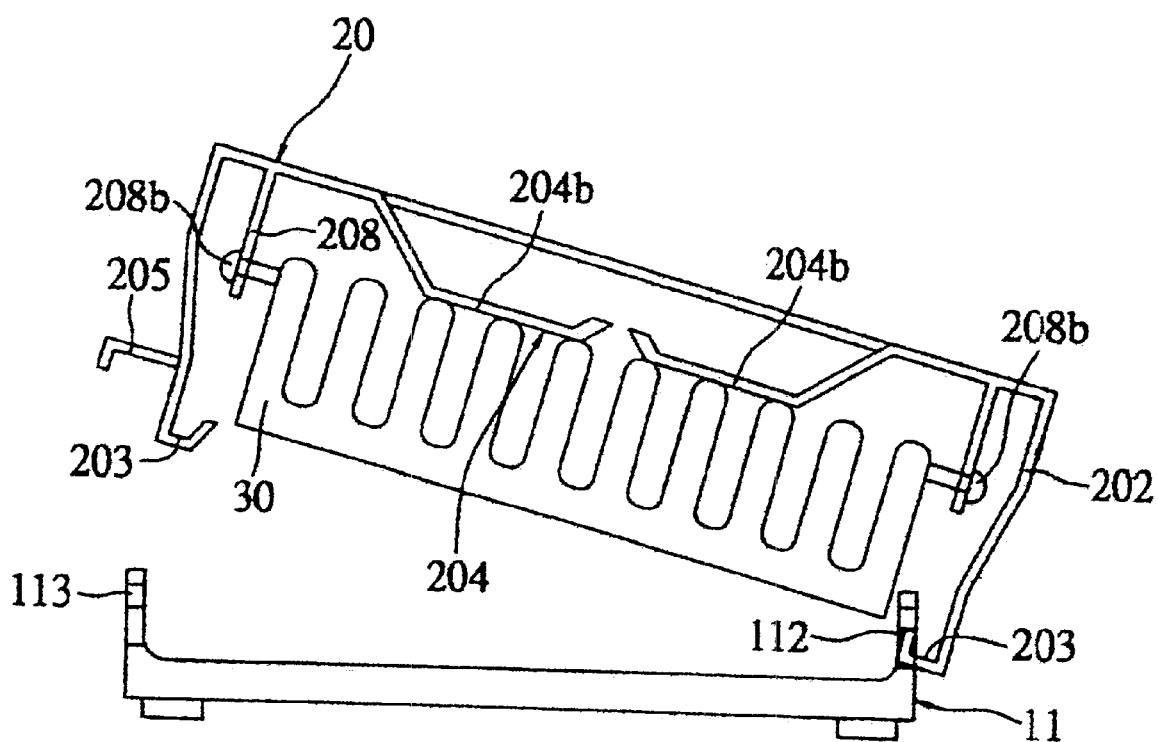
FIG. 5 is an orthographic drawing that illustrates the utilization procedure of the heat sink coupling device of the invention herein.

Referring to FIG. 5, the drawing that illustrates the utilization procedure of the heat sink coupling device of the invention herein, when operating personnel install the heat dissipation element 30 at the heat dissipation element clip mount 11, the heat dissipation element 30 is first secured onto the coupling base 20 by engaging the hooks 203 of the coupling base 20 right latch arms 202 into the anchoring holes 113 of the corresponding right stops 112 and then utilizing the hooks 203 along the right side of the coupling base 20 as a fulcrum of leverage, the operating personal rotates in the direction indicated in the drawing to engage the hooks 203 of the coupling base 20 left latch arms 202 into the anchoring holes 113 of the corresponding left stops 112, at which time the guide plates 208 extending down from the two sides of the coupling base 20 are fastened to the top lateral edges of the heat dissipation element 30 such that the heat dissipation element 30 is situated on it in the correct latched position and, furthermore, the retaining sections 204b of the elastic elements 204 proceeding downward in a free-floating state from the two sides of the coupling base 20 are at the same time flexed against the top surface of the heat dissipation element 30 such that the heat dissipation element 30 is immovably adjoined to the heat dissipation element clip mount 11; since the completion of the said installation of the heat dissipation element 30 at the heat dissipation element clip mount 11 only involves a single, simple step by the operator which, compared to the heat dissipation element affixing method shown in FIG. 1, considerably reduces installation time, the invention herein is suitable for high volume, assembly line computer manufacturing applications and is capable of significantly lowering production time and costs.

Furthermore, when the heat sink coupling device of the invention herein is removed, it is only necessary to push up the pull handle 205 on the cross-member 207 at one side of the coupling base 20 or do the same utilizing a screwdriver inserted into a slit 205a on the pull handle 205 which thereby spreads apart the said latch arms 202 along the said side, causing with full convenience the disengagement of the hooks 203 of the latch arms 202 from the anchoring holes 113 of the coupling base 20 that allows the efficient removal of the entire coupling base 20 to facilitate the inspection or replacement of the heat dissipation element 30 or a central processing unit.

However, the said arrangement is only utilized to elaborate the physical embodiment of the invention herein and shall not be construed as limitation on the range of practical embodiments possible based on the present invention and, furthermore, all modification and embellishments thereof by persons skilled in the technology adapted from the spirit and principles of the present invention, such as converting the circular opening 200 of the coupling base 20 into a square or the other shape as well as punch forming the elastic elements 204 and the latch arms 202 of the coupling base 20 at differing locations, shall remain within the scope and claims of the invention herein.

What is claimed is:

1. A heat sink coupling device comprised of:

A coupling base, the top surface of which provides for the selectable installation of wide range of different specification cooling fans;

A circular opening at the center of the said coupling base that provides for the intake of air;

Latch arms extending downward from the four corners of the said coupling base, with each said latch arm having a curved hook formed at the bottom end;

Elastic elements at the two sides of the said coupling base that are punched formed into a projecting, free-floating state.

2. As mentioned in claim 1 of the heat sink coupling device of the invention herein, the said coupling base has a plurality of screw holes arrayed inward along the diagonal corner axes of its top surface to provide for the selectable installation of different specification cooling fans onto the said coupling base.

3. As mentioned in claim 1 of the heat sink coupling device of the invention herein, the said elastic elements are punched out and formed at the two sides of the said coupling base, with each said elastic element having at the center a curvilinearly profiled retaining section that is capable of exerting force downward when the said elastic element is flexed.

4. As mentioned in claim 1 of the heat sink coupling device of the invention herein, the said circular opening at the center of the said coupling base has a bevelled surface formed along its inner circumference that serves as a diverting edge.

5. As mentioned in claim 1 of the heat sink coupling device of the invention herein, the four corners of the said coupling base consist of the said latch arms that are punched out and contoured and, furthermore, two said latch arms at the same side are connected by one cross member to increase the amount of lateral pull force withstandable by the said latch arms.

6. As mentioned in claim 1 of the heat sink coupling device of the invention herein, the said coupling base has a guide plate that is punched formed and bent out laterally at each of its two sides that directs a heat dissipation element ensconced in the said coupling base to the correct latched position.

7. As mentioned in claim 1 of the heat sink coupling device of the invention herein, the said coupling base is of one-piece, press formed construction.

8. As mentioned in claim 1 of the heat sink coupling device of the invention herein, the said coupling base has a pull handle disposed on the said cross member between the said two latch arms along one of its sides and, furthermore, a slit in the said pull handle provides for the insertion of a screwdriver to push up the said pull handle and thereby spread apart the said latch arms along the said side.

9. As mentioned in claim 6 of the heat sink coupling device of the invention herein, the said coupling base guide plates have a vertical, elongated guide hole disposed at an appropriate position along each of their two sides that provide for the insertion of screws into threaded holes at the two sides of the said heat dissipation element for fastening it inside the said coupling base and, furthermore, the said guide plates have clearance variability towards two sides.

* * * * *